US012727397B2

(12) United States Patent
Chen et al.

(10) Patent No.: US 12,727,397 B2
(45) Date of Patent: Sep. 1, 2026

(54) PHASE-CHANGE MATERIAL (PCM) RADIO FREQUENCY (RF) SWITCHING DEVICE WITH NOVEL SPREADER DESIGN

(71) Applicant: Taiwan Semiconductor Manufacturing Company, Ltd., Hsinchu (TW)

(72) Inventors: Huan-Chieh Chen, Taichung (TW); Yao-Wen Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 555 days.

(21) Appl. No.: 18/171,380

(22) Filed: Feb. 20, 2023

(65) Prior Publication Data

US 2024/0284808 A1 Aug. 22, 2024

(51) Int. Cl.
*H10N 70/00* (2023.01)
*H10N 70/20* (2023.01)

(52) U.S. Cl.
CPC ....... *H10N 70/8613* (2023.02); *H10N 70/023* (2023.02); *H10N 70/026* (2023.02); *H10N 70/063* (2023.02); *H10N 70/066* (2023.02); *H10N 70/231* (2023.02)

(58) Field of Classification Search
CPC .. H10N 70/023; H10N 70/026; H10N 70/063; H10N 70/066; H10N 70/231; H10N 70/8413; H10N 70/8828; H10N 70/823; H10N 70/8613; H10W 40/20–28
See application file for complete search history.

(56) References Cited

U.S. PATENT DOCUMENTS

| | | | | |
|---|---|---|---|---|
| 2019/0333839 | A1* | 10/2019 | Pillarisetty | H10W 40/28 |
| 2020/0058703 | A1* | 2/2020 | Slovin | H10N 39/00 |
| 2020/0058856 | A1* | 2/2020 | Howard | H10N 70/231 |
| 2020/0058863 | A1* | 2/2020 | El-Hinnawy | H10N 70/823 |
| 2020/0058864 | A1* | 2/2020 | El-Hinnawy | H10N 70/8613 |
| 2021/0135100 | A1* | 5/2021 | Slovin | H10N 70/861 |
| 2024/0276897 | A1* | 8/2024 | Chen | H10N 70/8613 |

* cited by examiner

*Primary Examiner* — Scott B Geyer

(74) *Attorney, Agent, or Firm* — Kilpatrick Townsend & Stockton LLP

(57) ABSTRACT

A phase-change material (PCM) switching device includes: a base dielectric layer; a spreader element disposed in the base dielectric layer, wherein the spreader element extends in a first horizontal direction and comprises: a central portion extending in the first horizontal direction and having a first width in a second horizontal direction perpendicular to the first horizontal direction; a first end portion at a first end of the central portion and having a second width in the second horizontal direction; and a second end portion at a second end of the central portion and having a third width in the second horizontal direction, and wherein at least one of the second width and the third width is larger than the first width; a heater element disposed over the spreader element; a thermal barrier element disposed on the heater element; and a PCM layer disposed on the thermal barrier element.

20 Claims, 11 Drawing Sheets

PHASE-CHANGE MATERIAL (PCM) RADIO FREQUENCY (RF) SWITCHING DEVICE WITH NOVEL SPREADER DESIGN

FIELD

Embodiments of the present disclosure relate generally to radio frequency (RF) devices, and more particularly to phase-change material (PCM) RF switching devices.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
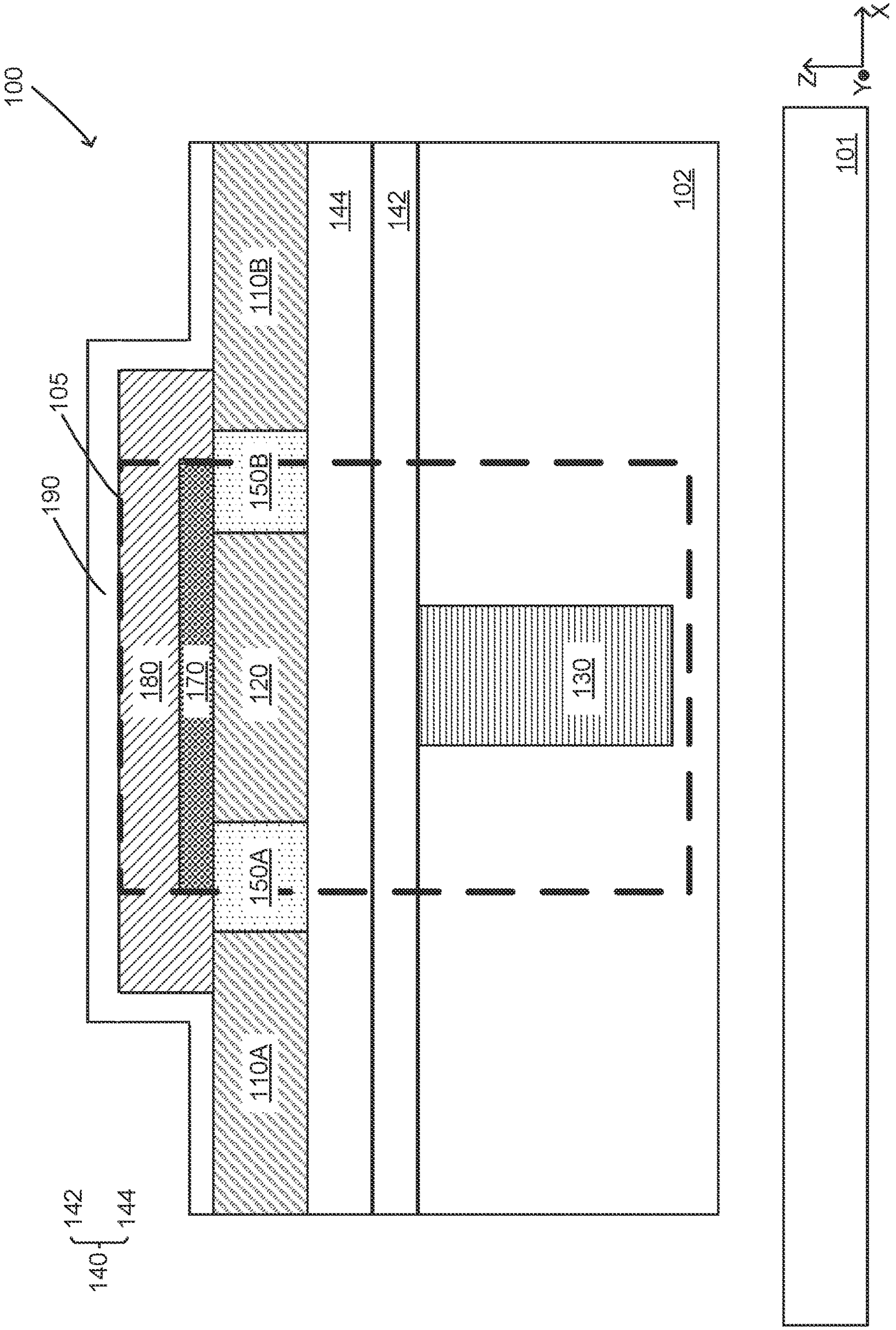
FIG. 1A is a cross-sectional diagram illustrating an example PCM RF switch in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

A radio frequency (RF) switch or a microwave switch (sometimes also referred to as an "RF switching device" or a "microwave switching device") is a device to route high-frequency signals through transmission paths. RF or microwave switches are used extensively in microwave test systems for signal routing between instruments and devices under test (DUT). In addition, RF switches are widely used in wireless communication.

A phase-change material (PCM) RF switch is a new type of RF switch. PCM RF switches operate based on the PCM switching mechanism. The PCM switching mechanism is a mechanism of reversible switching of a PCM between resistive states, i.e., an amorphous OFF state or phase (i.e., a high resistance state) and a crystalline ON state or phase (i.e., a low resistance state). The reversible switching is enabled by changing the phase of the PCM, which includes a structure that may change phase between amorphous and crystalline based on, for example, temperature change sequences via joule heating. Joule heating involves the heat that is produced during the flow of an (electric) current through, for example, a conductive material. As the PCM changes phase from crystalline to amorphous, for example, due to heating and cooling sequences controlled by, for example, applied voltage biases from the control circuitry, the resistance of the PCM changes from low to high, respectively. Accordingly, a PCM RF switch can be turned on or off by switching between the high resistance state and the low resistance state.

Joule heating is typically controlled by temperature pulses (implemented by current pulses) with the desired pulse width and the desired falling time. In the reset operation (i.e., changing from the crystalline state to the amorphous state), a high current is used to raise the temperature of the PCM above its melting temperature, with a fast cooling (i.e., a relatively short falling time) to quench the PCM to prevent re-crystallization. In the set operation (i.e., changing from the amorphous state to the crystalline state), a medium current is used to raise the temperature of the PCM above its crystallization temperature but below its melting temperature. The pulse width is relatively long for nucleation formation, while the falling time is relatively long for crystal growth.

In some implementations, a spreader element is disposed in the PCM RF switch to facilitate the dissipation of the heat generated by a heater element used for Joule heating. The spreader element can improve the quench speed, thus preventing reset failure (i.e., an unsuccessful attempt to change from the crystalline state to the amorphous state) of the PCM RF switch.

Conventionally, the spreader element is elongated and has a rectangular shape in a horizontal plane and extends in a horizontal direction. As a result, the temperature profile of the PCM layer is nonuniform along the extension direction of the spreader element. The temperature at the center of the PCM layer is typically lower than the temperature at the two ends or edges of the PCM layer, along the extension direction of the spreader element. In one example, the temperature difference between the center and the edges is about 100° C.

The nonuniform temperature profile may result in nonuniform quench speed. The center of the PCM layer is quenched faster than the edges of the PCM layer. That is, the temperature of the center of the PCM layer falls faster than the temperature of the edges of the PCM layer does, along the extension direction of the spreader element. As a result, the edges of the PCM layers are prone to re-crystallization as the temperature is above the crystallization temperature. Consequently, the center of the PCM layer may be in the amorphous state, while the edges of the PCM layer may be in the crystalline state. The coexistence of the amorphous state and the crystalline state may cause failure of the functioning of the PCM RF switch.

On the other hand, the nonuniform temperature profile may lead to thermal damage occurring at the thermal barrier layer disposed between the PCM layer and the heater element. The damage may cause poor endurance of the PCM RF switch.

In accordance with some aspects of the disclosure, a phase-change material (PCM) switching device is provided. The PCM switching device includes, among other components, a base dielectric layer, a spreader element, a heater element, two RF pads, a thermal barrier element, a PCM layer, and a top dielectric layer. The spreader element is operable to provide a heat dissipation path from the PCM layer and the heater element to the spreader element. The spreader element is elongated and extends in a first horizontal direction. Unlike the conventional the spreader element, the spreader element has nonuniform widths in a second horizontal direction perpendicular to the first horizontal direction. Specifically, the width at the edges of the spreader element is larger than the width at the center of the spreader element.

In one embodiment, the spreader element includes a central portion, a first end portion, and a second end portion. The central portion extends in the first horizontal direction and has a first width in a second horizontal direction; the first end portion has a second width in the second horizontal direction; the second end portion has a third width in the second horizontal direction. At least one of the second width and the third width is larger than the first width.

As a result, heat dissipation at the edges of PCM layer in the first horizontal direction is increased due to the enlarged area. Therefore, the temperature profile of the PCM layer becomes more uniform along the extension direction of the spreader element (i.e., in the first horizontal direction). The more uniform temperature profile results in more uniform quench speed of the PCM layer in the Y-direction. The risk of re-crystallization in the reset operation is mitigated. Consequently, the chance of the coexistence of the amorphous state and the crystalline state is reduced, and the thermal stability of the PCM RF switch is improved.

Details of the PCM switching device and these benefits will be described below with references to FIGS. 1A-5.

EXAMPLE PCM RF SWITCH

Figure 1B:
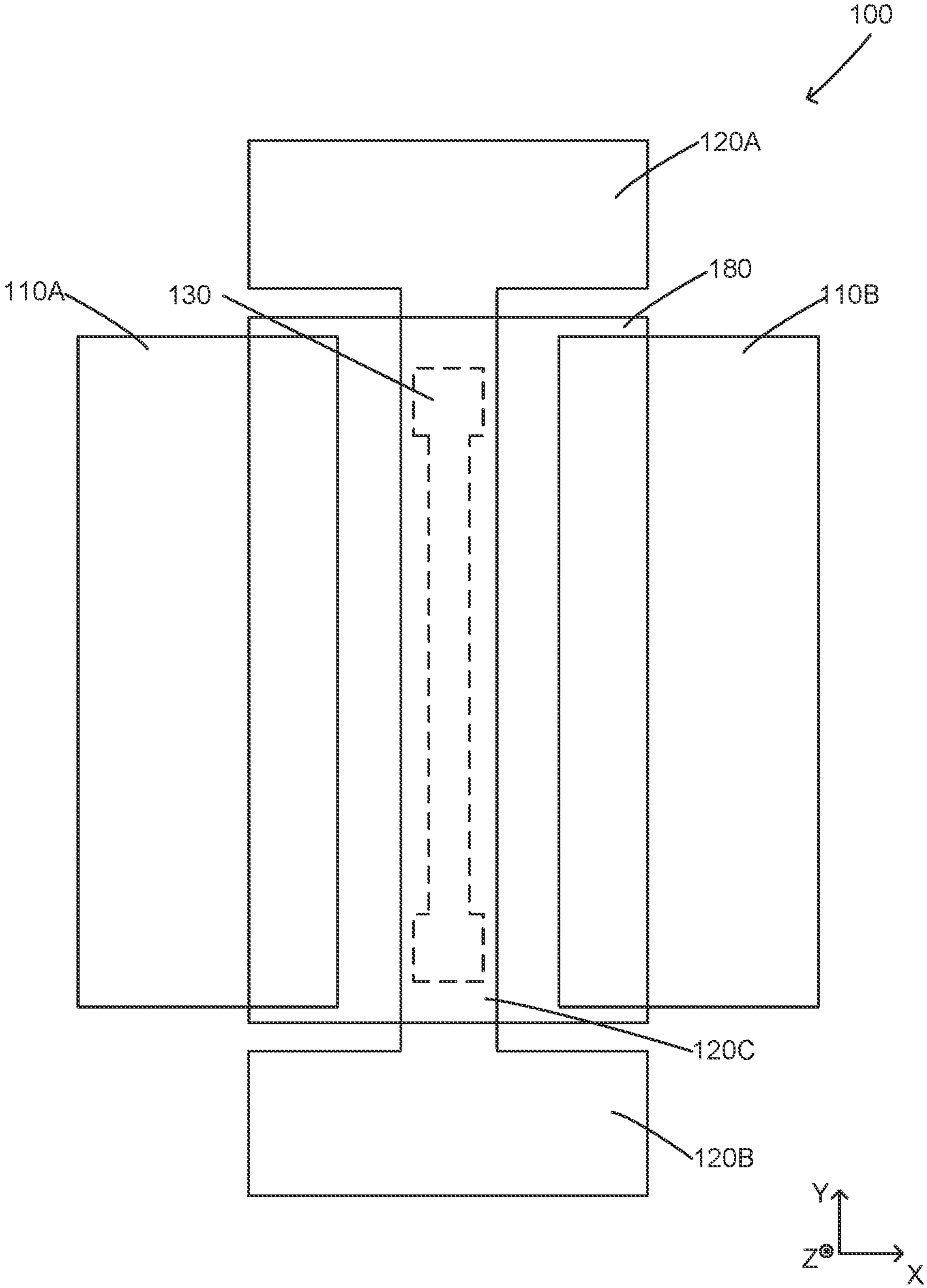
FIG. 1B is a diagram illustrating the layout corresponding to the example PCM RF switch 100 shown in FIG. 1A in accordance with some embodiments.
Figure 1C:
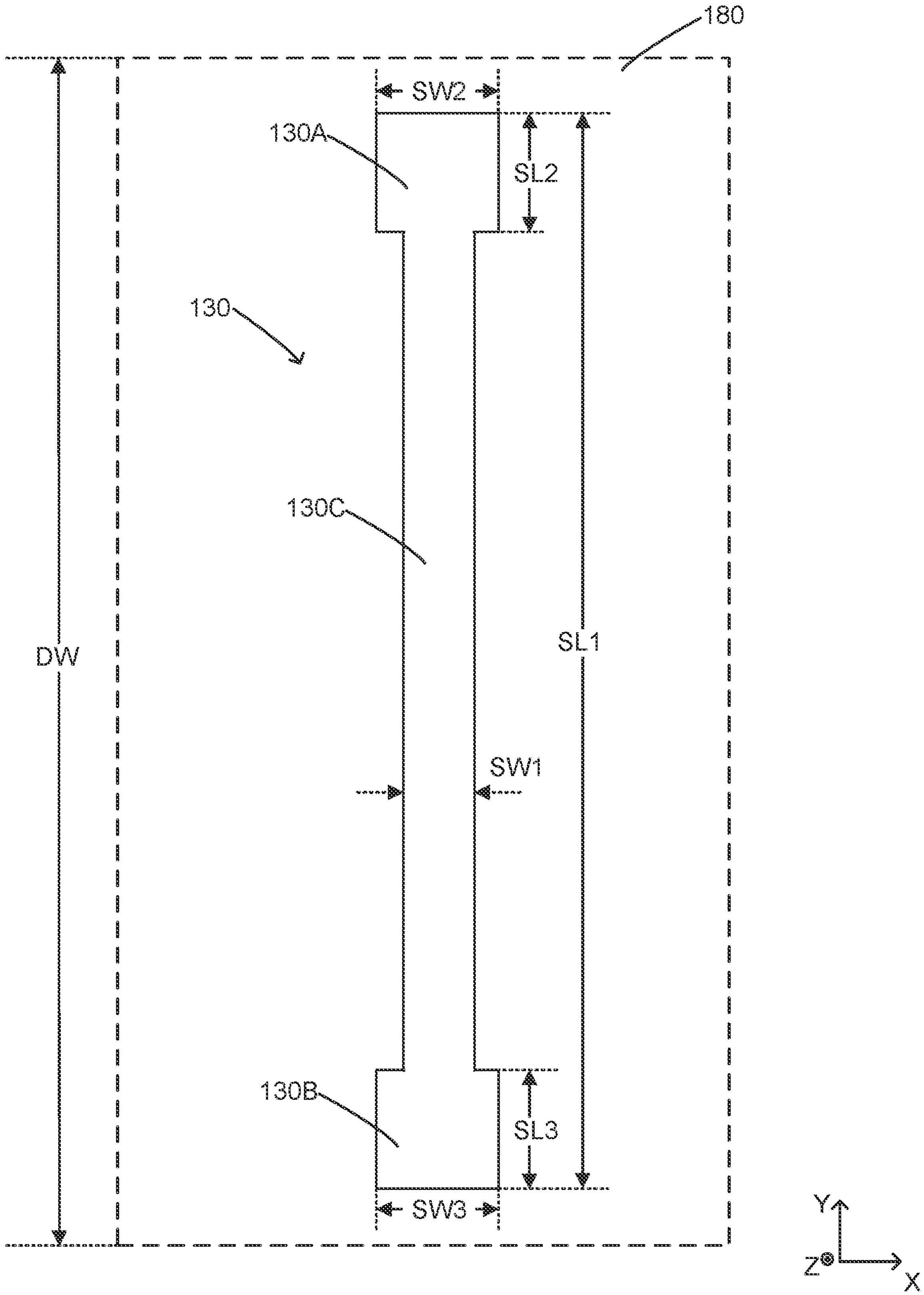
FIG. 1C is a diagram illustrating an example spreader element in accordance with some embodiments.
Figure 1D:
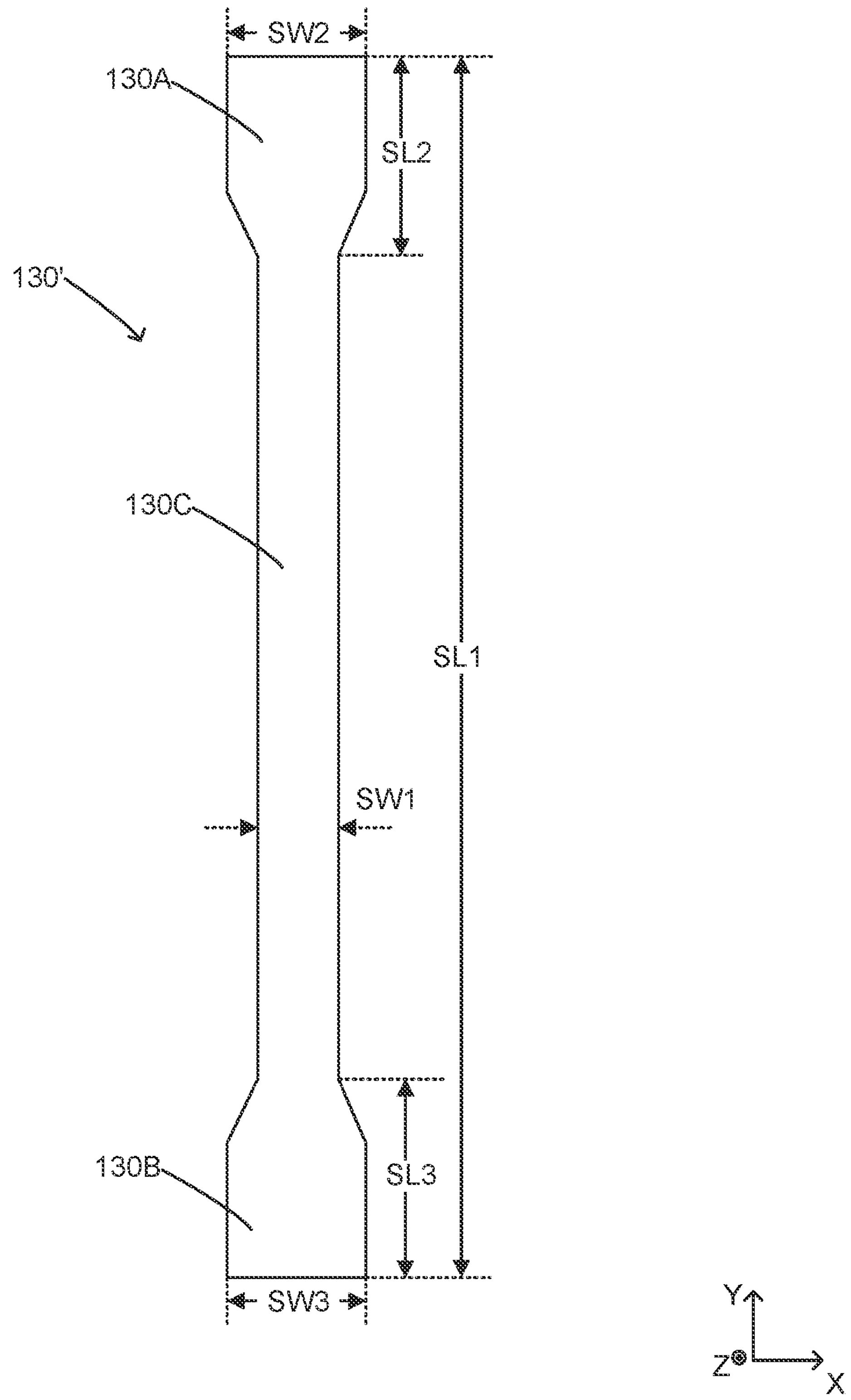
FIG. 1D is a diagram illustrating another example spreader element in accordance with some embodiments.
Figure 1E:
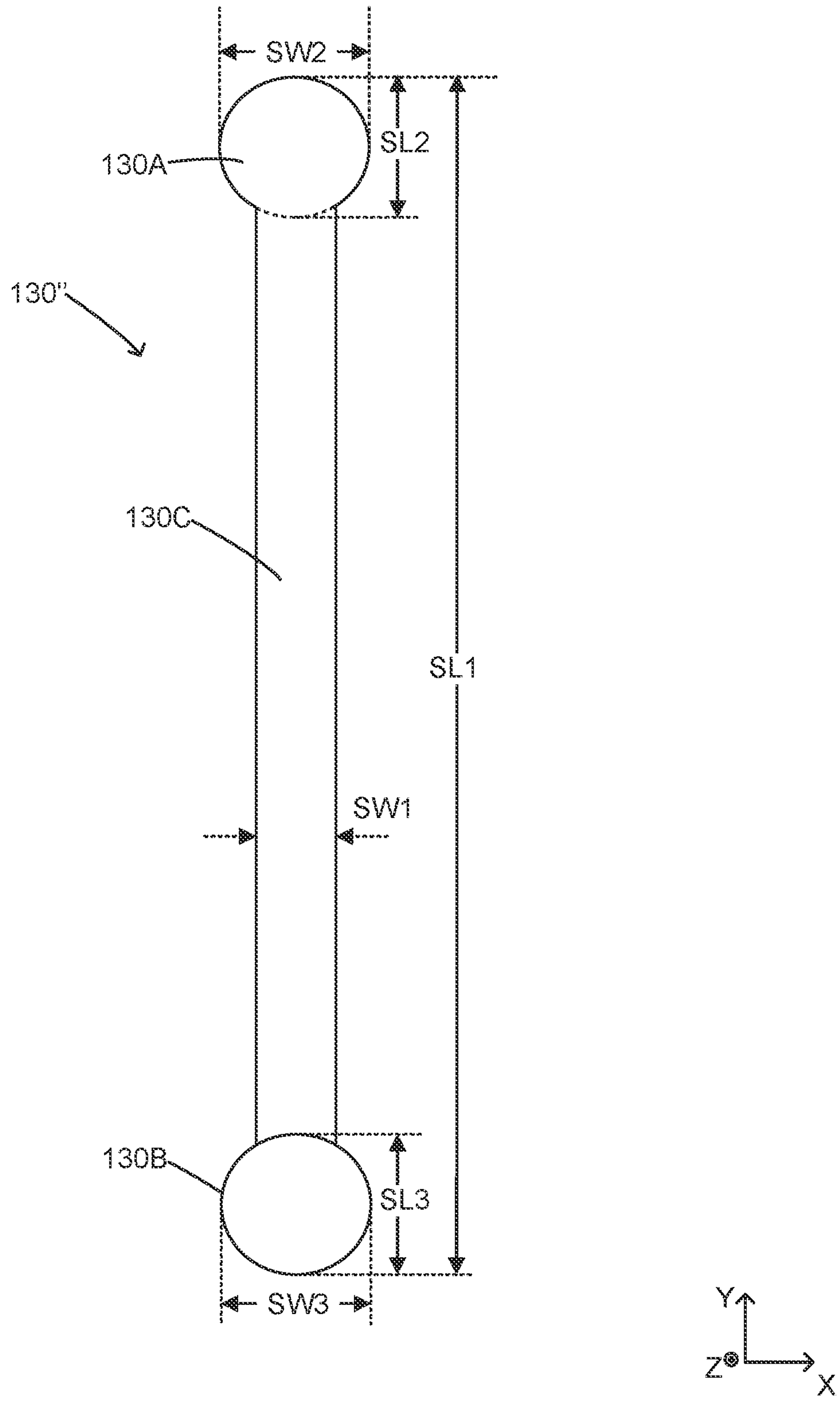
FIG. 1E is a diagram illustrating yet another example spreader element in accordance with some embodiments.

FIG. 1A is a cross-sectional diagram illustrating an example PCM RF switch (i.e., PCM switching device) 100 in accordance with some embodiments. FIG. 1B is a diagram illustrating the layout 100' corresponding to the example PCM RF switch 100 shown in FIG. 1A in accordance with some embodiments. FIG. 1C is a diagram illustrating an example spreader element 130 in accordance with some embodiments. FIG. 1D is a diagram illustrating another example spreader element 130' in accordance with some embodiments. FIG. 1E is a diagram illustrating yet another example spreader element 130" in accordance with some embodiments. It should be understood that FIGS. 1A-1E are not drawn to scale.

In the example shown in FIGS. 1A and 1B, the example PCM RF switch 100 includes, among other elements, a base dielectric layer 102, a spreader element 130, at least one dielectric layer 140 (e.g., a first dielectric layer 142 and a second dielectric layer 144 in the example shown in FIG. 1A), a heater element 120, two RF pads (sometimes also referred to as "metal pads") 110A and 110B, two separator elements 150A and 150B, a thermal barrier element 170, a PCM layer 180, and a top dielectric layer 190. It should be understood that the PCM RF switch 100 may include other components such as structures electrically connected to the RF pads 110A and 110B. It should also be understood that the PCM RF switch 100 is typically fabricated using back end of line (BEOL) of fabrication.

The spreader element 130 is disposed in the base dielectric layer 102, which is disposed over a semiconductor substrate 101 schematically shown in FIG. 1A. In one embodiment, the base dielectric layer 102 comprises silicon dioxide. In other embodiments, the base dielectric layer 102 comprises other suitable dielectric materials. In one embodiment, the base dielectric layer 102 is an interlayer dielectric (ILD) layer disposed in a multilayer interconnect (MLI) structure, at the back end of an integrated circuit, over a semiconductor substrate comprising, for example, silicon. It should be understood that these embodiments and examples are not intended to be limiting.

In the example shown in FIGS. 1A and 1B, the spreader element 130 is disposed in a trench formed in the base dielectric layer 102. The top surface of the spreader element 130 is coplanar with the top surface of the base dielectric layer 102. The spreader element 130 is operable to provide a heat dissipation path from the PCM layer 180 and the heater element 120 to the spreader element 130, thereby improving the quench speed and preventing the reset failure of the PCM RF switch 100. In one embodiment, the ratio of the height of the spreader element 130 in the vertical direction (i.e., the Z-direction shown in FIG. 1A) to the height of the at least one dielectric layer 140 is between 0.5 and 20.

In the example shown in FIGS. 1A and 1B, the spreader element 130 is elongated and extends in a first horizontal direction (i.e., the Y-direction shown in FIGS. 1A and 1B). Unlike the conventional spreader element, which has a rectangular shape in a horizontal plane (i.e., the X-Y plane shown in FIGS. 1A and 1B), the spreader element 130 has nonuniform widths in a second horizontal direction (i.e., the X-direction shown in FIGS. 1A and 1B) perpendicular to the first horizontal direction.

As shown in FIGS. 1B and 1C, the spreader element 130 includes a central portion 130C, a first end portion 130A, and a second end portion 130B. The central portion 130C has a rectangular shape; both the first end portion 130A and the second end portion 130B may have a rectangular or a square shape. The first end portion 130A and the second end portion 130B are located at two ends of the central portion 130C, which extends in the Y-direction. The central portion 130C has a first width (i.e., SW1 shown in FIG. 1C) in the X-direction; the first end portion 130A has a second width (i.e., SW2 shown in FIG. 1C) in the X-direction; the second end portion 130B has a third width (i.e., SW3 shown in FIG. 1C) in the X-direction. At least one of the second width and the third width is larger than the first width.

In some embodiments, the second width is the same as the third width. In some embodiments, the ratio of the second width to the first width (i.e., SW2/SW1) is between 1.2 and 2, and the ratio of the third width to the first width (i.e., SW3/SW1) is between 1.2 and 2. It should be understood that these embodiments are exemplary rather than limiting, and other ratio values may be employed in other embodiments.

In other embodiments, the second width is different from the third width. In some embodiments, the second width is larger than the third width, and the third width is larger than the first width. In some embodiments, both the ratio of the second width to the first width (i.e., SW2/SW1) and the ratio of the third width to the first width (i.e., SW3/SW1) is between 1.2 and 2. It should be understood that these embodiments are exemplary rather than limiting, and other ratio values may be employed in other embodiments.

Since at least one of the second width and the third width is larger than the first width, heat dissipation at the edges of PCM layer 180 in the Y-direction is increased due to the enlarged area. As a result, the temperature profile of the PCM layer 180 becomes more uniform along the extension direction of the spreader element (i.e., in the Y-direction shown in FIGS. 1A and 1B). In one example, the temperature difference between the center and the edges is about 30° C., which is significantly lower than the 100° C. temperature difference in the conventional situation.

The more uniform temperature profile results in more uniform quench speed of the PCM layer 180 in the Y-direction. The risk of re-crystallization in the reset operation is mitigated. Consequently, the chance of the coexistence of the amorphous state and the crystalline state is reduced, and the thermal stability of the PCM RF switch 100 is improved.

In the example shown in FIG. 1C, the spreader element 130 has a first length (i.e., SL1 shown in FIG. 1C) in the Y-direction, whereas the first end portion 130A and the second end portion 130B have a second length (i.e., SL2 shown in FIG. 1C) and a third length (i.e., SL3 shown in FIG. 1C), respectively, in the Y-direction. In some embodiments, the ratio of the sum of the second length and the third length to the first length (i.e., (SL2+SL3) SL1) is smaller than 0.5, especially when a fourth width (i.e., DW shown in FIG. 1C) in the Y-direction is larger than 3 μm. It should be understood that these embodiments are exemplary rather than limiting, and other ratio values may be employed in other embodiments.

In the example shown in FIG. 1C, the PCM layer 180 has a fourth width (i.e., DW shown in FIG. 1C) in the Y-direction. In some embodiments, the ratio of the first length to the fourth width (i.e., SL1 DW) is larger than 0.8. It should be understood that these embodiments are exemplary rather than limiting, and other ratio values may be employed in other embodiments.

In one embodiment, the spreader element 130 comprises copper (Cu). In another embodiment, the spreader element 130 comprises aluminum copper alloy (AlCu). In yet another embodiment, the spreader element 130 comprises tungsten (W). In still another embodiment, the spreader element 130 comprises gold (Au). It should be understood that these embodiments are exemplary rather than limiting, and other materials may be employed in other embodiments.

The first dielectric layer 142 is disposed on the top surface of the base dielectric layer 102. The second dielectric layer 144 is disposed on the first dielectric layer 142. In one embodiment, the first dielectric layer 142 is an etching stop layer, and the second dielectric layer 144 is an oxide layer. In one example, the etching stop layer is a silicon carbide (SiC) layer. It should be understood that the at least one dielectric layer 140 may include one dielectric layer or more than two dielectric layers in other embodiments. Each of the at least one dielectric layer 140 may comprise one of the following: silicon dioxide, silicon carbide, silicon nitride, and aluminum nitride.

In the example shown in FIGS. 1A and 1B, the heater element 120 is disposed on the second dielectric layer 144 and over the spreader element 130. That is, the heater element 120 and the spreader element 130 are substantially aligned in the X-direction, which facilitates good heat dissipation. As shown in FIG. 1B, the heater element 120 includes a first end portion (sometimes also referred to as a "first heat pad") 120A, a second end portion (sometimes also referred to as a "second heat pad") 120B, and an elongated portion 120C. The elongated portion 120C extends in the Y-direction. When a voltage is applied, electric current flows between the first end portion 120A and the second end portion 120B of the heater element 120 through the elongated portion 120C. As mentioned above, the heat generated by the heater element 120 can be controlled by the electric current.

It is advantageous that the material of the heater element 120 has a relatively high thermal conductivity and a relatively low electrical resistivity. The relatively high thermal conductivity contributes to better thermal transmission efficiency, whereas the relatively low electrical resistivity contributes to a higher write operation efficiency.

In some embodiments, the candidate materials of the heater element 120 include tungsten (W), titanium (Ti), aluminum (Al), and tantalum (Ta). Using the coefficient of linear thermal expansion (CLTE) as the measurement, the CLTE of tungsten (W) is $4.5\times10^{-6}$ $K^{-1}$; the CLTE of titanium (Ti) is $8.6\times10^{-6}$ $K^{-1}$; the CLTE of aluminum (Al) is $23.1\times10^{-6}$ $K^{-1}$; the CLTE of tantalum (Ta) is $6.4\times10^{-6}$ $K^{-1}$.

In the example shown in FIGS. 1A and 1B, the RF pads 110A and 110B are disposed on the second dielectric layer 144. The RF pad 110A is disposed at a first side (e.g., the left side) of the heater element 120 in the X-direction, with a separator element 150A therebetween; the RF pad 110B is disposed at a second side (e.g., the right side) of the heater element 120 in the X-direction, with a separator element 150B therebetween. In other words, the RF pad 110A and the RF pad 110B are disposed on the second dielectric layer 144 at two sides of the heater element 120 in the X-direction, respectively. Each of the separator elements 150A and 150B comprise a dielectric material such as silicon dioxide. As mentioned above, other components such as structures (e.g., vias) electrically connected to the RF pads 110A and 110B can be utilized to electrically connect the PCM RF switch 100 to, for example, a circuit. In other words, the electric signal passes through the PCM layer 180, in the X-direction, from the RF pad 110A t the RF pad 110B, or vice versa.

As shown in FIGS. 1A and 1B, each of the RF pads 110A and 110B is in contact with the PCM layer 180. Therefore, there is an electrical path (i.e., the read path) from the RF pad 110A, through the PCM layer 180, to the RF pad 110B. The read path is separated from the write path. When the PCM layer 180 is in the amorphous state, the electrical path is cut off, and the PCM RF switch 100 is turned off. When the PCM layer 180 is in the crystalline state, the electrical path is created, and the PCM RF switch 100 is turned on.

In one embodiment, the heater element 120 and the RF pads 110A and 110B are made of the same material, such as tungsten (W), titanium (Ti), aluminum (Al), and tantalum (Ta). In one implementation, the heater element 120 and the RF pads 110A and 110B are fabricated in the same process by patterning a metal layer using an etching process.

In the example shown in FIGS. 1A and 1B, the thermal barrier element 170 is disposed on the heater element 120. The thermal barrier element 170 is sandwiched between the heater element 120 and the PCM layer 180 in the Z-direction. The thermal barrier element 170 comprises a dielectric material such as silicon nitride. The thermal barrier element 170 is operable to insulate the heater element 120 and the PCM layer 180 and prevent phase segregation (i.e., change in the composition of the PCM layer 180) after multiple cycles.

The PCM layer 180 is disposed on the thermal barrier element 170 and the RF pads 110A and 110B. Two ends of the PCM layer 180 in the X-direction are in contact with the RF pads 110A and 110B, respectively. Specifically, a first end of the PCM layer 180 in the X-direction is disposed on and electrically connected to the RF pad 110A, and a second end of the PCM layer 180 in the X-direction is disposed on and electrically connected to the RF pad 110B. A central region of the PCM layer 180 between the first end and the second end is above the top surface of the thermal barrier element 170.

As described above, the resistive states of the PCM layer 180 can go through reversible switching between the amorphous state and the crystalline state. That is, the PCM layer 180 comprises a PCM operable to switch between an amorphous state and a crystalline state in response to heat generated by the heater element 120. As the PCM layer 180 changes phase between the crystalline state and the amorphous state, the PCM RF switch 100 is turned on or turned off accordingly.

In some examples, the PCM of the PCM layer 180 comprises one or more layers of a binary system of Ga—Sb, In—Sb, In—Se, Sb—Te, Ge—Te, and Ge—Sb; a ternary system of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $GezSb_2Te_5$, tungsten oxide, nickel oxide, copper oxide, or combinations thereof. In one embodiment, the PCM of the PCM layer 180 comprises germanium telluride (GeTe). In one embodiment, the PCM of the PCM layer 180 comprises antimony telluride ($Sb_2Te_3$). It should be understood that these materials are exemplary rather than limiting. In some implementations, the PCM layer 180 is formed by chemical vapor deposition (CVD), physical vapor deposition (PVD), pulsed laser deposition (PLD), sputtering, atomic layer deposition (ALD), or any other suitable thin film deposition processes.

The phase transition between the crystalline state and the amorphous state of the PCM layer 180 is related to the interplay between the long-range order and the short-range order of the structure of the material of the PCM layer 180. For example, the collapse of the long-range order generates the amorphous state. The long-range order in the crystalline state facilitates electrical conduction, while the amorphous state impedes electrical conduction and results in high electrical resistance. To tune the properties of the PCM layer 180 for different needs, the material of the PCM layer 180 may be doped with various elements at different amounts to adjust the proportion of the short-range order and the long-range order inside the bonding structure of the material. The doped element may be any element used for semiconductor doping through the use of, for example, ion implantation or diffusion.

The top dielectric layer 190 is disposed on the PCM layer 180 and the RF pads 110A and 110B. The top dielectric layer 190 functions as a protective layer that prevents the PCM layer 180 from being, for example, oxidized. In one embodiment, the top dielectric layer 190 comprises silicon nitride. It should be understood that other materials can be employed in other embodiments.

In the example shown in FIG. 1D, the spreader element 130' includes a central portion 130C, a first end portion 130A, and a second end portion 130B. The central portion 130C has a rectangular shape; the first end portion 130A and the second end portion 130B have a trapezoid shape. The first end portion 130A and the second end portion 130B are located at two ends of the central portion 130C, which extends in the Y-direction. The central portion 130C has a first width (i.e., SW1 shown in FIG. 1D) in the X-direction; the first end portion 130A has a second width (i.e., SW2 shown in FIG. 1D) in the X-direction; the second end portion 130B has a third width (i.e., SW3 shown in FIG. 1D) in the X-direction. Likewise, at least one of the second width and the third width is larger than the first width.

In some embodiments, the second width is the same as the third width. In some embodiments, the ratio of the second width to the first width (i.e., SW2/SW1) is between 1.2 and 2, and the ratio of the third width to the first width (i.e., SW3/SW1) is between 1.2 and 2. It should be understood that these embodiments are exemplary rather than limiting, and other ratio values may be employed in other embodiments.

In other embodiments, the second width is different from the third width. In some embodiments, the second width is larger than the third width, and the third width is larger than the first width. In some embodiments, both the ratio of the second width to the first width (i.e., SW2/SW1) and the ratio of the third width to the first width (i.e., SW3/SW1) is between 1.2 and 2. It should be understood that these embodiments are exemplary rather than limiting, and other ratio values may be employed in other embodiments.

In the example shown in FIG. 1D, the spreader element 130 has a first length (i.e., SL1 shown in FIG. 1D) in the Y-direction, whereas the first end portion 130A and the second end portion 130B have a second length (i.e., SL2 shown in FIG. 1D) and a third length (i.e., SL3 shown in FIG. 1D), respectively, in the Y-direction. In some embodiments, the ratio of the sum of the second length and the third length to the first length (i.e., (SL2+SL3) SL1) is smaller than 0.5, especially when a fourth width (i.e., DW shown in FIG. 1C) in the Y-direction is larger than 3 μm. It should be understood that these embodiments are exemplary rather than limiting, and other ratio values may be employed in other embodiments.

In the example shown in FIG. 1E, the spreader element 130" includes a central portion 130C, a first end portion 130A, and a second end portion 130B. The central portion 130C has a rectangular shape; the first end portion 130A and the second end portion 130B have a circular shape. The first end portion 130A and the second end portion 130B are located at two ends of the central portion 130C, which extends in the Y-direction. The central portion 130C has a first width (i.e., SW1 shown in FIG. 1E) in the X-direction; the first end portion 130A has a second width (i.e., SW2 shown in FIG. 1E) in the X-direction; the second end portion 130B has a third width (i.e., SW3 shown in FIG. 1E) in the X-direction. Likewise, at least one of the second width and the third width is larger than the first width.

In some embodiments, the second width is the same as the third width. In some embodiments, the ratio of the second width to the first width (i.e., SW2/SW1) is between 1.2 and 2, and the ratio of the third width to the first width (i.e., SW3/SW1) is between 1.2 and 2. It should be understood that these embodiments are exemplary rather than limiting, and other ratio values may be employed in other embodiments.

In other embodiments, the second width is different from the third width. In some embodiments, the second width is larger than the third width, and the third width is larger than the first width. In some embodiments, both the ratio of the second width to the first width (i.e., SW2/SW1) and the ratio of the third width to the first width (i.e., SW3/SW1) is between 1.2 and 2. It should be understood that these embodiments are exemplary rather than limiting, and other ratio values may be employed in other embodiments.

In the example shown in FIG. 1E, the spreader element 130 has a first length (i.e., SL1 shown in FIG. 1E) in the Y-direction, whereas the first end portion 130A and the second end portion 130B have a second length (i.e., SL2 shown in FIG. 1E) and a third length (i.e., SL3 shown in FIG. 1E), respectively, in the Y-direction. In some embodiments, the ratio of the sum of the second length and the third length to the first length (i.e., (SL2+SL3)/SL1) is smaller than 0.5, especially when a fourth width (i.e., DW shown in FIG. 1C) in the Y-direction is larger than 3 μm. It should be understood that these embodiments are exemplary rather than limiting, and other ratio values may be employed in other embodiments.

For both spreader elements 130' and 130", since the second width is larger than the first width, heat dissipation at the edges of PCM layer 180 in the Y-direction is increased due to the enlarged area. As a result, the temperature profile of the PCM layer 180 becomes more uniform along the extension direction of the spreader element (i.e., in the Y-direction shown in FIGS. 1A and 1B). In one example, the temperature difference between the center and the edges is about 30° C., which is significantly lower than the 100° C. temperature difference in the conventional situation.

The more uniform temperature profile results in more uniform quench speed of the PCM layer 180 in the Y-direction. The risk of re-crystallization in the reset operation is mitigated. Consequently, the chance of the coexistence of the amorphous state and the crystalline state is reduced, and the thermal stability of the PCM RF switch 100 is improved.

It should be understood that the embodiments shown in FIGS. 1C-1E are exemplary rather than limiting. Other geometries of the first end portion 130A and the second end portion 130B may be employed in other embodiments, as long as the first end portion 130A and the second end portion 130B may have a dimension in the X-direction that is larger than the first width (i.e., SW1 shown in FIGS. 1C-1E) of the central portion 130C.

Example Fabrication Process

Figure 2:
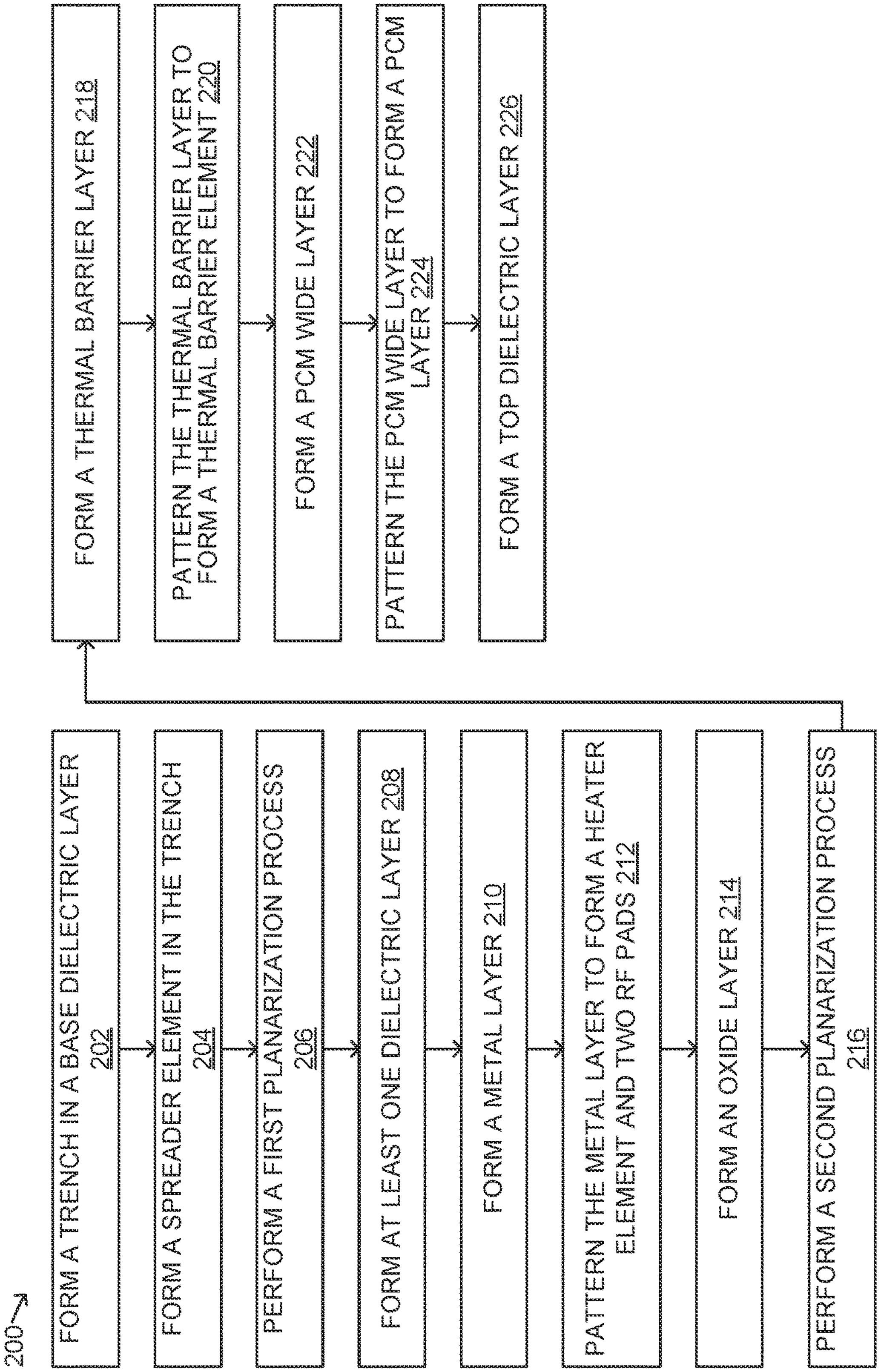
FIG. 2 is a flowchart diagram illustrating an example method for fabricating a PCM RF switch in accordance with some embodiments.

FIG. 2 is a flowchart diagram illustrating an example method 200 for fabricating a PCM RF switch in accordance with some embodiments. In the example shown in FIG. 2, the method 200 includes operations 202, 204, 206, 208, 210, 212, 214, 216, 218, 220, 222, 224, and 226. Additional operations may be performed. Also, it should be understood that the sequence of the various operations discussed above with reference to FIG. 2 is provided for illustrative purposes, and as such, other embodiments may utilize different sequences. These various sequences of operations are to be included within the scope of embodiments. FIGS. 3A-3F are cross-sectional views of a portion of the PCM RF switch at various stages of fabrication in accordance with some embodiments.

The method 200 starts with operation 202. At operation 202, a trench is formed in a base dielectric layer. In one implementation, the trench is formed by patterning the base dielectric layer using an etching process. The geometry of the trench corresponds to the spreader element to be formed inside the trench. In one embodiment, the base dielectric layer comprises silicon dioxide.

At operation 204, a spreader element is formed in the trench by filling a metal material or a metal alloy material in the trench. In one implementation, the spreader element is formed using electroplating. It should be understood that the spreader element may be formed using other suitable processes in other embodiments. In one embodiment, the spreader element comprises copper (Cu). In another embodiment, the spreader element comprises aluminum copper alloy (AlCu). In yet another embodiment, the spreader element comprises tungsten (W). In still another embodiment, the spreader element comprises gold (Au).

At operation 206, a first planarization process is performed. In one implementation, the first planarization process is a chemical-mechanical polishing (CMP) process. After the first planarization process, the excess portion of spreader element outside the trench is removed, and a substantially flat top surface of the base dielectric layer and the spreader element is achieved.

Figure 3A:
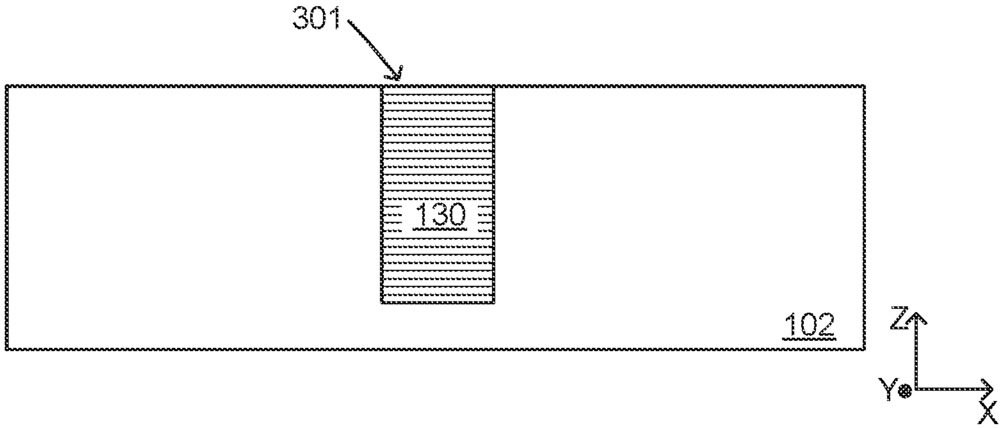
FIGS. 3A-3F are cross-sectional views of a portion of the PCM RF switch at various stages of fabrication in accordance with some embodiments.

In the example shown in FIG. 3A, the spreader element 130 is formed in the trench 301 in the base dielectric layer 102. The top surface of the spreader element 130 is coplanar with the top surface of the base dielectric layer 102. Although only one cross-section is shown in FIG. 3A, it should be understood that the spreader element 130 extends in the Y-direction shown in FIG. 3A and has nonuniform widths in the X-direction shown in FIG. 3A. Examples of the geometry of the spreader element 130 include those shown in FIGS. 1C-1E.

At operation 208, at least one dielectric layer is formed on the base dielectric layer and the spreader element. In one implementation, the at least one dielectric layer is formed using chemical vapor deposition (CVD). In other implementations, the at least one dielectric layer is formed using physical vapor deposition (PVD), pulsed laser deposition (PLD), sputtering, atomic layer deposition (ALD), or any other suitable processes.

At operation 210, a metal layer is formed on the at least one dielectric layer. In one implementation, the metal layer is formed using electroplating. It should be understood that the metal layer may be formed using other suitable processes in other embodiments. The metal layer will subsequently be patterned, using an etching process, to form the heater element and the RF pads, which will be discussed below.

Figure 3B:
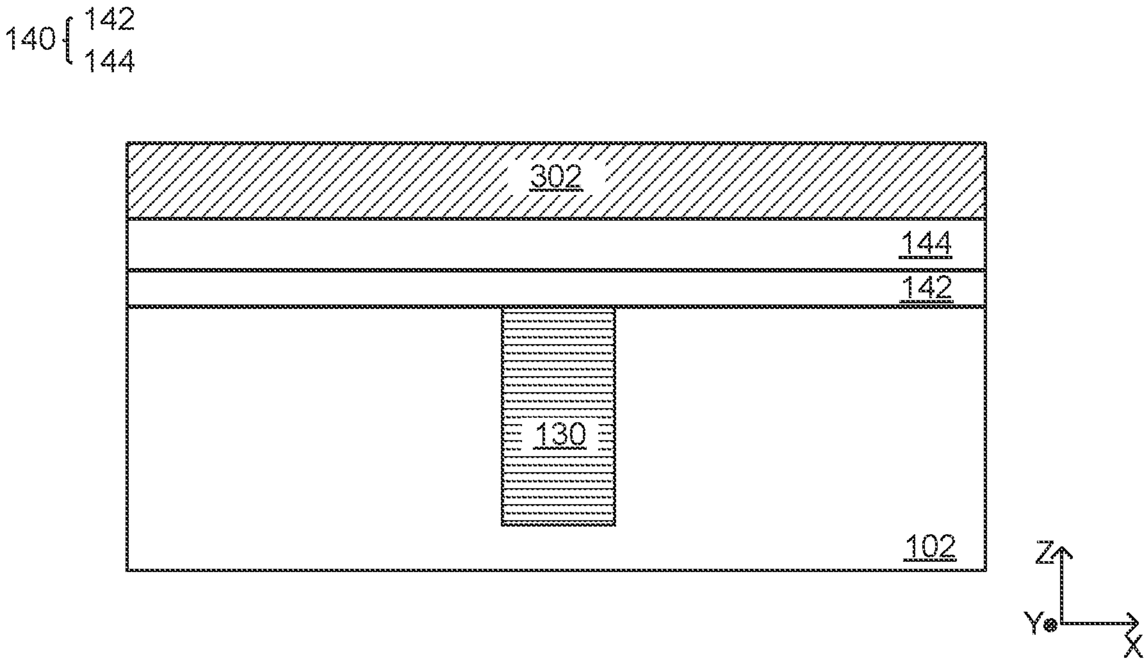

In the example shown in FIG. 3B, the first dielectric layer 142 is formed on the top surface of the base dielectric layer 102. The second dielectric layer 144 is disposed on the first dielectric layer 142. The metal layer 302 is formed on the second dielectric layer 144. In one embodiment, the first dielectric layer 142 is an etching stop layer, and the second dielectric layer 144 is an oxide layer. In one example, the etching stop layer is a silicon carbide (SiC) layer. In one embodiment, the metal layer 302 is a tungsten layer. In another embodiment, the metal layer 302 is a titanium layer. In yet another embodiment, the metal layer 302 is an aluminum layer. In still another embodiment, the metal layer 302 is a tantalum layer.

At operation 212, the metal layer is patterned using an etching process. Consequently, a heater element and two RF pads are formed. In one implementation, a photoresist layer is formed on the metal layer and then patterned, using photolithography, and the exposed region of the metal layer is etched subsequently. Gaps are formed between the heater element and the two RF pads.

At operation 214, an oxide layer is formed. The oxide layer fills the gaps between the heater element and the two RF pads. In one implementation, the oxide layer is formed using CVD. In other implementations, the oxide layer is formed using PVD, PLD, sputtering, ALD, or any other suitable processes.

At operation 216, a second planarization process is performed. In one implementation, the second planarization process is a CMP process. After the second planarization process, the oxide layer that is outside the gaps between the heater element and the two RF pads is removed.

Figure 3C:
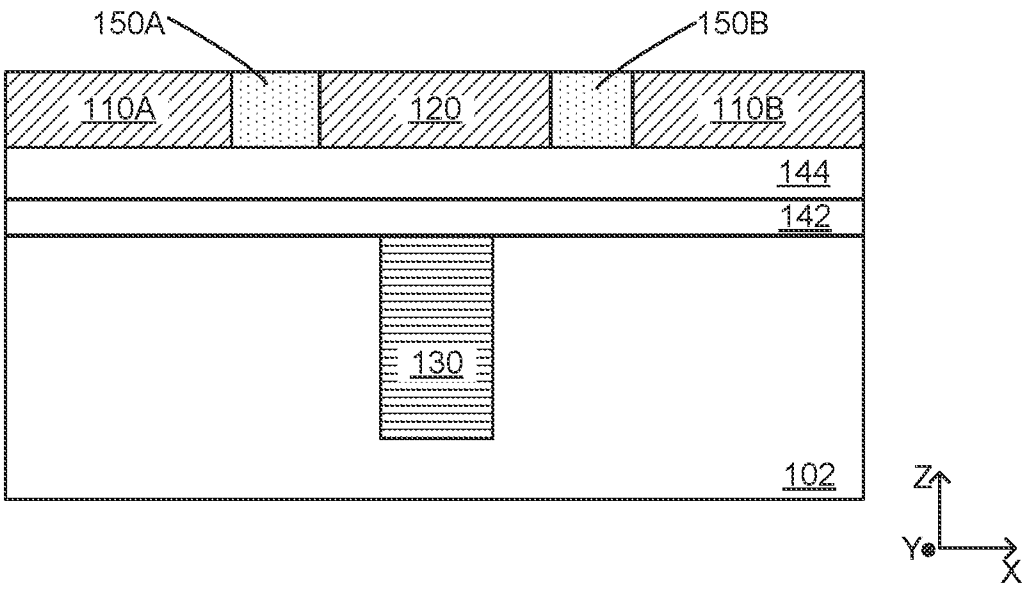

In the example shown in FIG. 3C, the heater element 120 is formed on the second dielectric layer 144 and over the spreader element 130. Although only one cross-section is shown in FIG. 3C, it should be understood that the heater element 120 includes a first end portion (e.g., the first end portion 120A shown in FIG. 1B), a second end portion (e.g., the second end portion 120B shown in FIG. 1B), and an elongated portion (e.g., the elongated portion 120C shown in FIG. 1B). The RF pad 110A is disposed at a left side of the heater element 120 in the X-direction, with a separator element 150A therebetween; the RF pad 110B is disposed at a right side of the heater element 120 in the X-direction, with a separator element 150B therebetween. Each of the separator elements 150A and 150B comprise a dielectric material such as silicon dioxide.

At operation 218, a thermal barrier layer is formed. In one implementation, the thermal barrier layer is formed using CVD. In other implementations, the thermal barrier layer is formed using PVD, PLD, sputtering, ALD, or any other suitable processes.

At operation 220, the thermal barrier layer is patterned using an etching process to form a thermal barrier element. In one implementation, a photoresist layer is formed on the thermal barrier layer and then patterned, using photolithography, and the exposed region of the thermal barrier layer is etched subsequently.

Figure 3D:
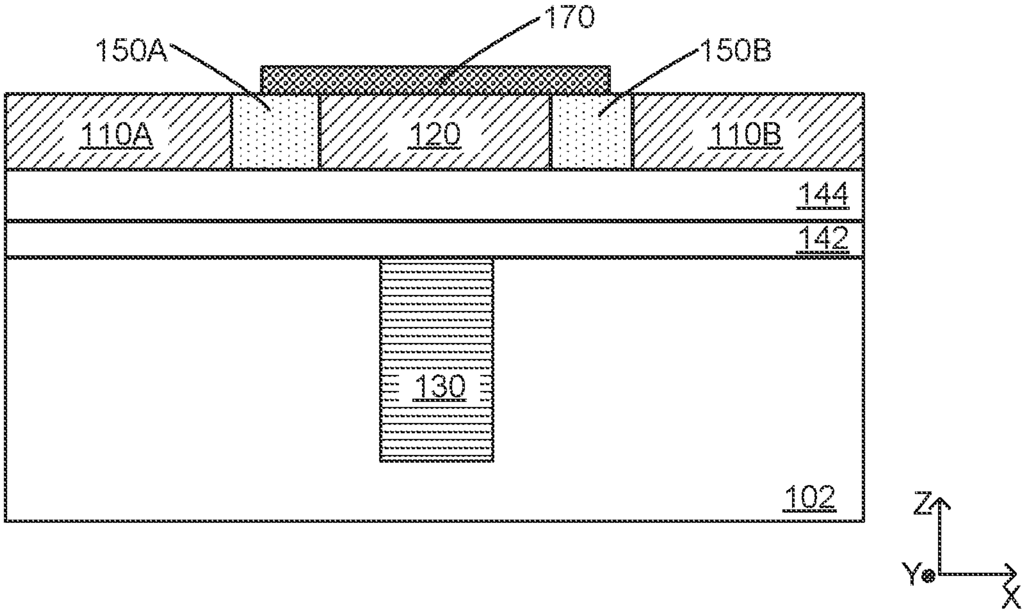

In the example shown in FIG. 3D, the thermal barrier element 170 is formed on the heater element 120. The thermal barrier element 170 overlaps with the separator elements 150A and 150B at two ends in the X-direction, respectively. In one embodiment, the thermal barrier element 170 comprises a dielectric material such as silicon nitride.

At operation 222, a PCM wide layer is formed. The PCM wide layer is formed on the thermal barrier element, the separator elements, and the RF pads. In one implementation, the PCM wide layer is formed using CVD. In other implementations, the PCM wide layer is formed using PVD, PLD, sputtering, ALD, or any other suitable thin film deposition processes.

As mentioned above, the PCM wide layer may comprise one or more layers of a binary system of Ga—Sb, In—Sb, In—Se, Sb—Te, Ge—Te, and Ge—Sb; a ternary system of Ge—Sb—Te, In—Sb—Te, Ga—Se—Te, Sn—Sb—Te, In—Sb—Ge, and Ga—Sb—Te; a quaternary system of Ag—In—Sb—Te, Ge—Sn—Sb—Te, Ge—Sb—Se—Te, Te—Ge—Sb—S, Ge—Sb—Te—O, and Ge—Sb—Te—N; a chalcogenide alloy containing one or more elements from Group VI of the periodic table, a Ge—Sb—Te alloy, $Ge_2Sb_2Te_5$, tungsten oxide, nickel oxide, copper oxide, or combinations thereof. It should be understood that these materials are exemplary rather than limiting.

At operation 224, the PCM wide layer is patterned, using an etching process, to form a PCM layer. In one implementation, a photoresist layer is formed on the PCM layer and then patterned, using photolithography, and the exposed region of the PCM layer is etched subsequently.

Figure 3E:
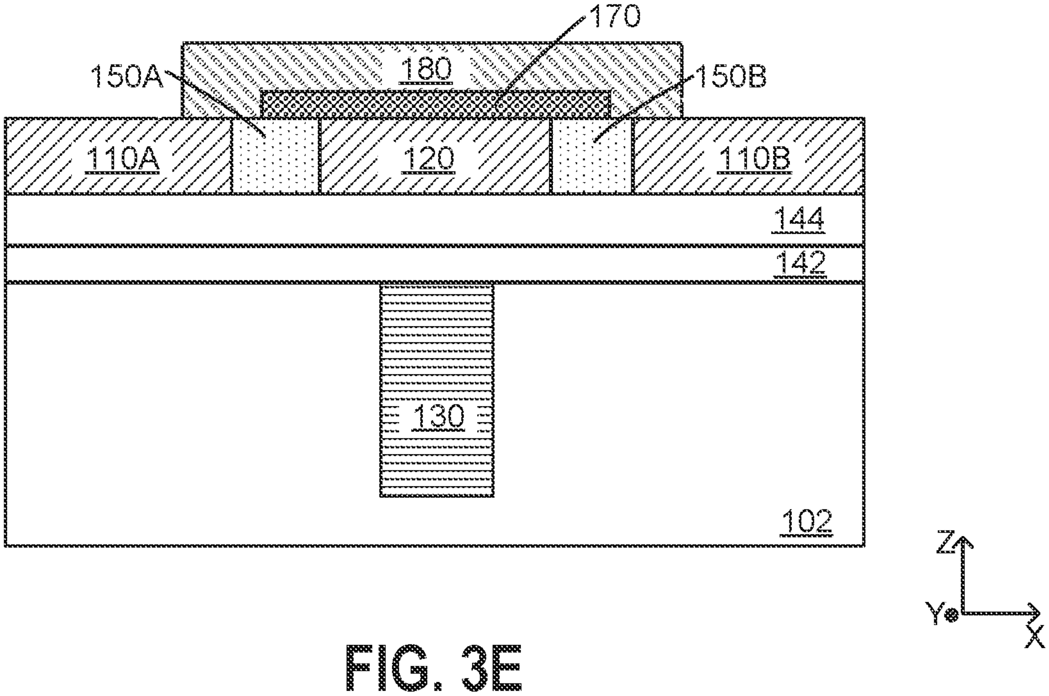

In the example shown in FIG. 3E, the PCM layer 180 is formed on the thermal barrier element 170 and the RF pads 110A and 110B. Two ends of the PCM layer 180 in the X-direction are in contact with the RF pads 110A and 110B, respectively. A central region of the PCM layer 180 between the first end and the second end is above the top surface of the thermal barrier element 170.

At operation 226, a top dielectric layer is formed. In one implementation, the top dielectric layer is formed using CVD. In other implementations, the top dielectric layer is formed using PVD, PLD, sputtering, ALD, or any other suitable processes. In one embodiment, the top dielectric layer comprises silicon nitride.

Figure 3F:
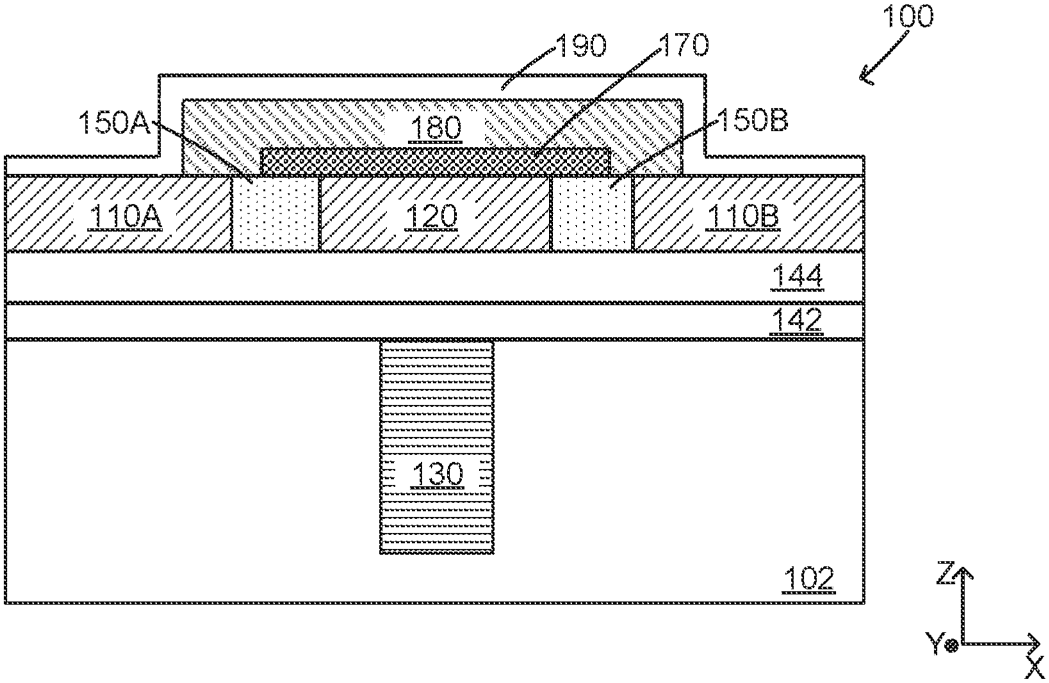

In the example shown in FIG. 3F, the top dielectric layer 190 is formed on the PCM layer 180 and the RF pads 110A and 110B. The top dielectric layer 190 functions as a protective layer that prevents the PCM layer 180 from being, for example, oxidized.

As such, the example PCM RF switch 100 is fabricated.

Improved Temperature Profile Uniformity and Quench Speed Uniformity

Figure 4A:
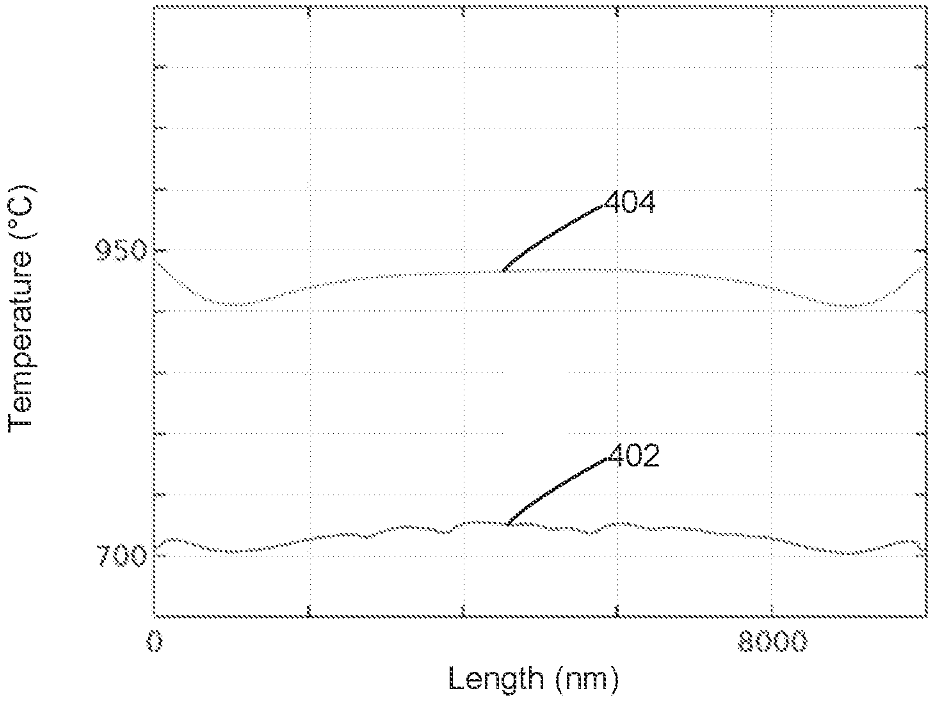
FIG. 4A is a diagram illustrating an example temperature profile of a PCM layer and a thermal barrier element of a PCM RF switch in accordance with some embodiments.

FIG. 4A is a diagram illustrating an example temperature profile of a PCM layer and a thermal barrier element of a PCM RF switch in accordance with some embodiments. In the example shown in FIG. 4A, curve 402 is the temperature profile of a PCM layer (e.g., the PCM layer 180 shown in FIG. 1A) of a PCM RF switch (e.g., the PCM RF switch 100 shown in FIG. 1A); curve 404 is the temperature profile of a thermal barrier element (e.g., the thermal barrier element 170 shown in FIG. 1A) of the PCM RF switch. The temperature of the PCM layer varies along the extension direction (e.g., the Y-direction shown in FIG. 1A) of the spreader element (e.g., the spreader element 130 shown in FIG. 1A). Likewise, the temperature of the thermal barrier element varies along the extension direction of the spreader element.

As mentioned above, the spreader element of a conventional PCM RF switch is elongated and has a rectangular shape in a horizontal plane and extends in a horizontal direction. As a result, the temperature profile of the PCM layer is nonuniform along the extension direction of the spreader element. The temperature at the center of the PCM layer is typically lower than the temperature at the two ends or edges of the PCM layer, along the extension direction of the spreader element. In one example, the temperature difference between the center and the edges is about 100° C.

In contrast, the spreader element (e.g., the spreader element 130 shown in FIGS. 1A and 1B) disclosed herein has nonuniform widths (e.g., the second width SW2 and the first width SW1 shown in FIG. 1C) in a second horizontal direction (i.e., the X-direction shown in FIG. 1C). Since the second width is larger than the first width, heat dissipation at the edges of PCM layer is increased due to the enlarged area. As a result, the temperature profile of the PCM layer becomes more uniform along the extension direction of the spreader element. In the example shown in FIG. 4A, the temperature difference between the center and the edges of the PCM layer is about 30° C., which is significantly lower than the 100° C. temperature difference in the conventional situation. Likewise, the temperature difference between the center and the edges of the thermal barrier element is about 50° ° C., which is significantly lower than the 200° C. temperature difference in the conventional situation.

Figure 4B:
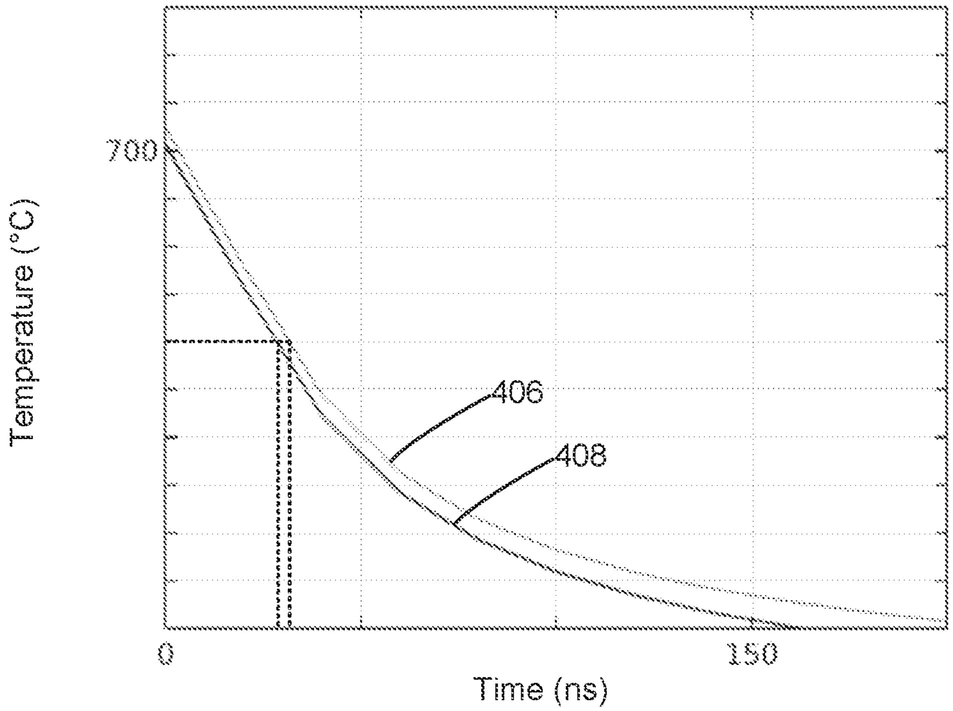
FIG. 4B is a diagram illustrating an example quench speed of a PCM layer of a PCM RF switch in accordance with some embodiments.

FIG. 4B is a diagram illustrating an example quench speed of a PCM layer of a PCM RF switch in accordance with some embodiments. In the example shown in FIG. 4B, curve 406 is the quench speed curve of the center of a PCM layer (e.g., the PCM layer 180 shown in FIG. 1A) of a PCM RF switch (e.g., the PCM RF switch 100 shown in FIG. 1A); curve 408 is the quench speed curve of the edges of the PCM layer of the PCM RF switch. The temperature of the center of the PCM layer and the temperature of the edges of the PCM layer drop over time.

In the example shown in FIG. 4B, the chance of re-crystallization is relatively high when the temperature drops to 500° C. As mentioned above, the spreader element of a conventional PCM RF switch is elongated and has a rectangular shape in a horizontal plane and extends in a horizontal direction. As a result, the temperature of the center of the PCM layer and the temperature of the edges of the PCM layer do not drop at the same quench speed. The temperature of the center of the PCM layer typically drops faster than the temperature of the edges of the PCM layer, along the extension direction of the spreader element. It takes about 50 ns for the edges of the PCM layer to reach 500° C., and the quench speed deviation is relatively large.

In contrast, the spreader element (e.g., the spreader element 130 shown in FIGS. 1A and 1B) disclosed herein has nonuniform widths (e.g., the second width SW2 and the first width SW1 shown in FIG. 1C) in a second horizontal direction (i.e., the X-direction shown in FIG. 1C). Since the second width is larger than the first width, heat dissipation at the edges of PCM layer is increased due to enlarged area. As a result, the temperature of the edges of the PCM layer drops faster than that in a conventional situation. In the example shown in FIG. 4B, it takes about 30 ns for the edges of the PCM layer to reach 500° C., and the quench speed deviation becomes relatively small (i.e., the curve 406 and the curve 408 become relatively closer). The risk of re-crystallization in the reset operation is mitigated.

Spreader Element Over the Heater Element

Although the spreader element 130 is below the heater element 120 in the example shown in FIG. 1A, other designs are available in other embodiments. In an alternative embodiment, the spreader element can be disposed above the heater element, while the PCM layer is disposed below the heater element.

Figure 5:
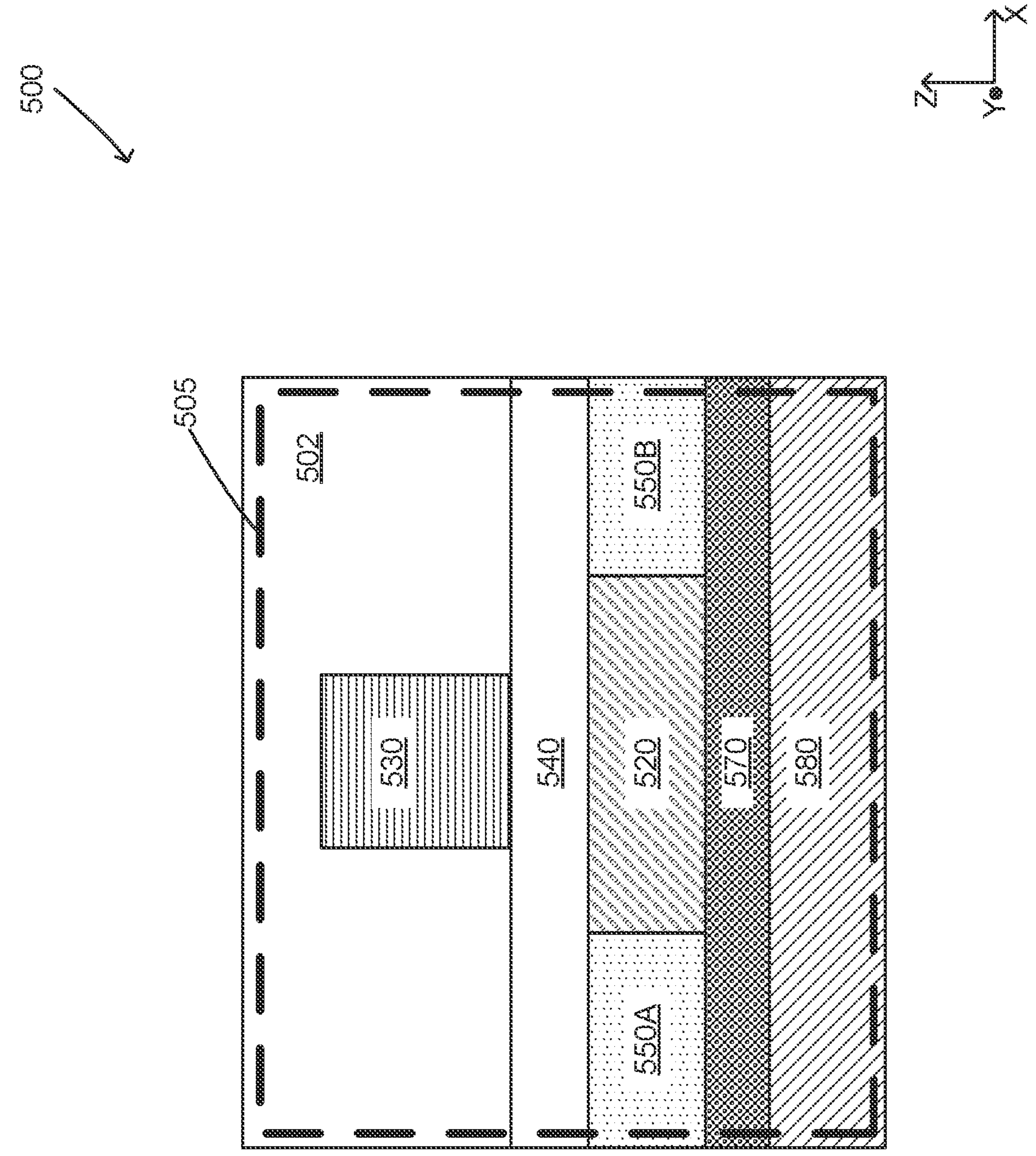
FIG. 5 is a cross-sectional diagram illustrating a portion of an example PCM RF switch in accordance with some embodiments.

FIG. 5 is a cross-sectional diagram illustrating a portion 505 of an example PCM RF switch 500 in accordance with some embodiments. The portion 505 corresponds to the portion 105 shown in FIG. 1A. In other words, the PCM RF switch 500 includes more than the portion 505 shown in FIG. 5. For example, the PCM RF switch 500 may also include two RF pads.

In the example shown in FIG. 5, a thermal barrier element 570 is disposed on the PCM layer 580, and a heater element 520 is disposed on the thermal barrier element 570. Two separator elements 550A and 550B are also disposed on the thermal barrier element 570. The separator elements 550A and 550B are disposed on two sides of the heater element 520 in the X-direction, respectively. At least one dielectric layer 540 is disposed on the heater element 520 and the separator elements 550A and 550B. A spreader element 530 is disposed on the at least one dielectric layer 540. The spreader element 530 is also disposed in a base dielectric layer 502. The bottom surface of the spreader element 530 is coplanar with the bottom surface of the base dielectric layer 502.

The PCM layer 580, the thermal barrier element 570, the heater element 520, the separator elements 550A and 550B, the at least one dielectric layer 540, the spreader element 530, the base dielectric layer 502 are similar to the PCM layer 180, the thermal barrier element 170, the heater element 120, the separator elements 150A and 150B, the at least one dielectric layer 140, the spreader element 130, the base dielectric layer 102 shown in FIG. 1A. Therefore, details of these components are not discussed.

Likewise, the spreader element 530 is elongated and extends in the Y-direction shown in FIG. 5, and the spreader element 530 has nonuniform widths in the X-direction shown in FIG. 5 along the Y-direction. Likewise, the spreader element 530 may include a central portion, a first end portion, and a second end portion. The first end portion and the second end portion are located at two ends of the central portion, which extends in the Y-direction shown in FIG. 5. The central portion has a first width in the X-direction, whereas the first end portion and the second end portion may have a second width in the X-direction. The second width is larger than the first width. In some embodiments, the ratio of the second width to the first width is between 1.2 and 2. It should be understood that these embodiments are exemplary rather than limiting, and other ratio values may be employed in other embodiments.

As discussed above, since the second width is larger than the first width, heat dissipation at the edges of PCM layer 580 in the Y-direction is increased due to enlarged area. As a result, the temperature profile of the PCM layer 580 becomes more uniform along the extension direction of the spreader element (i.e., in the Y-direction shown in FIG. 5). The more uniform temperature profile results in a more uniform quench speed of the PCM layer 580 in the Y-direction. The risk of re-crystallization in the reset operation is mitigated. Consequently, the chance of the coexistence of the amorphous state and the crystalline state is reduced, and the thermal stability of the PCM RF switch 500 is improved.

In one embodiment, the spreader element 530 comprises copper (Cu). In another embodiment, the spreader element 530 comprises aluminum copper alloy (AlCu). In yet another embodiment, the spreader element 530 comprises tungsten (W). In still another embodiment, the spreader element 530 comprises gold (Au). It should be understood that these embodiments are exemplary rather than limiting, and other materials may be employed in other embodiments.

In accordance with some aspects of the disclosure, a phase-change material (PCM) switching device is provided. The PCM switching device includes: a base dielectric layer over a semiconductor substrate; a spreader element disposed in the base dielectric layer, wherein the spreader element extends in a first horizontal direction and comprises: a central portion extending in the first horizontal direction and having a first width in a second horizontal direction perpendicular to the first horizontal direction; a first end portion at a first end of the central portion and having a second width in the second horizontal direction; and a second end portion at a second end of the central portion and having a third width in the second horizontal direction, and wherein at least one of the second width and the third width is larger than the first width; a heater element disposed over the spreader element; a thermal barrier element disposed on the heater element; and a PCM layer disposed on the thermal barrier element.

In accordance with some aspects of the disclosure, a method for fabricating a phase-change material (PCM) switching device is provided. The method includes the following operations: forming a trench in a base dielectric layer; filling a metal material or a metal alloy material in the trench to form a spreader element in the trench, wherein the spreader element extends in a first horizontal direction and comprises a central portion extending in the first horizontal direction, a first end portion at a first end of the central portion, and a second end portion at a second end of the central portion, and wherein the central portion has a first width in a second horizontal direction perpendicular to the first horizontal direction, and the first end portion has a second width in the second horizontal direction, and the second end portion has a third width in the second horizontal direction, and wherein at least one of the second width and the third width is larger than the first width; forming at least one dielectric layer on the base dielectric layer; forming a heater element and two (radio frequency) RF pads on the at least one dielectric layer; forming a thermal barrier element on the heater element; and forming a PCM layer on the thermal barrier element.

In accordance with some aspects of the disclosure, a phase-change material (PCM) switching device is provided. The PCM switching device includes: a base dielectric layer; a spreader element disposed in the base dielectric layer, wherein the spreader element extends in a first horizontal direction, and the spreader element has nonuniform widths in a second horizontal direction perpendicular to the first horizontal direction; a heater element disposed over the spreader element; a thermal barrier element disposed on the heater element; and a PCM layer disposed on the thermal barrier element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present 10 disclosure, and that they may make various changes, substitutions, and alterations herein without departing from the spirit and scope of the present disclosure.

What is claimed is:

1. A phase-change material (PCM) switching device, comprising:
- a base dielectric layer over a semiconductor substrate;
- a spreader element disposed in the base dielectric layer, wherein the spreader element extends in a first horizontal direction and comprises:
  - a central portion extending in the first horizontal direction and having a first width in a second horizontal direction perpendicular to the first horizontal direction;
  - a first end portion at a first end of the central portion and having a second width in the second horizontal direction; and
  - a second end portion at a second end of the central portion and having a third width in the second horizontal direction, and wherein at least one of the second width and the third width is larger than the first width;
- a heater element disposed over the spreader element;
- a thermal barrier element disposed on the heater element; and
- a PCM layer disposed on the thermal barrier element.

2. The PCM switching device of claim 1, wherein the second width is equal to the third width.

3. The PCM switching device of claim 2, wherein a ratio of the second width to the first width is between 1.2 and 2.

4. The PCM switching device of claim 1, wherein the second width is different from the third width.

5. The PCM switching device of claim 4, wherein the second width is larger than the third width, and the third width is larger than the first width.

6. The PCM switching device of claim 5, wherein a ratio of the second width to the first width is between 1.2 and 2.

7. The PCM switching device of claim 1, wherein the central portion has a rectangular shape.

8. The PCM switching device of claim 1, wherein both the first end portion and the second end portion have a rectangular shape.

9. The PCM switching device of claim 1, wherein at least one of the first end portion and the second end portion comprises a trapezoid shape.

10. The PCM switching device of claim 1, wherein at least one of the first end portion and the second end portion comprises a circular shape.

11. The PCM switching device of claim 1, further comprising:
- at least one dielectric layer disposed on the base dielectric layer, wherein the heater element is disposed on the at least one dielectric layer.

12. The PCM switching device of claim 11, further comprising:
- a first radio frequency (RF) pad disposed on the at least one dielectric layer and at a first side of the heater element in the second horizontal direction, wherein the first RF pad is in contact with the PCM layer; and
- a second RF pad disposed on the at least one dielectric layer and at a second side of the heater element in the second horizontal direction, wherein the second RF pad is in contact with the PCM layer.

13. The PCM switching device of claim 1, wherein the spreader element has a first length in the first horizontal direction, and the first end portion has a second length in the first horizontal direction, and the second end portion has a third length in the first horizontal direction, and wherein a ratio of a sum of the second length and the third length to the first length is smaller than 0.5.

14. The PCM switching device of claim 13, wherein the second length is different from the third length.

15. A phase-change material (PCM) switching device, comprising:

a base dielectric layer;

a spreader element disposed in the base dielectric layer, wherein the spreader element extends in a first horizontal direction, and the spreader element has nonuniform widths in a second horizontal direction perpendicular to the first horizontal direction;

a heater element disposed over the spreader element;

a thermal barrier element disposed on the heater element; and a PCM layer disposed on the thermal barrier element.

16. The PCM switching device of claim 15, wherein the spreader element comprises:

a central portion extending in the first horizontal direction and having a first width in the second horizontal direction;

a first end portion at a first end of the central portion and having the second width in the second horizontal direction; and a second end portion at a second end of the central portion and having a third width in the second horizontal direction, and wherein at least one of the second width and the third width is larger than the first width.

17. The PCM switching device of claim 16, wherein a ratio of the second width to the first width is between 1.2 and 2.

18. A method of forming a phase-change material (PCM) switching device, the method comprising:

forming a base dielectric layer;

forming a spreader element in the base dielectric layer, wherein the spreader element extends in a first horizontal direction, and the spreader element has nonuniform widths in a second horizontal direction perpendicular to the first horizontal direction;

forming a heater element over the spreader element;

forming a thermal barrier element on the heater element; and forming a PCM layer on the thermal barrier element.

19. The method of claim 18, wherein forming the spreader element comprises:

forming a central portion extending in the first horizontal direction and having a first width in the second horizontal direction;

forming a first end portion at a first end of the central portion and having the second width in the second horizontal direction; and forming a second end portion at a second end of the central portion and having a third width in the second horizontal direction, and wherein at least one of the second width and the third width is larger than the first width.

20. The method of claim 19, wherein a ratio of the second width to the first width is between 1.2 and 2.

* * * * *